US006825914B2

(12) United States Patent
Schroeder et al.

(10) Patent No.: US 6,825,914 B2
(45) Date of Patent: Nov. 30, 2004

(54) SYSTEM FOR FLUSHING AT LEAST ONE INTERNAL SPACE OF AN OBJECTIVE

(75) Inventors: Joachim Schroeder, Aalen (DE); Gerald Richter, Aalen-Hofen (DE); Dieter Schmerek, Aalen-Hofen (DE); Uwe Schubert, Aalen (DE); Maria Johanna Agnes Rubingh, Eindhoven (NL); Willem van Schaik, GL's Hertogenbosch (NL); Siebe Landheer, Eindhoven (NL)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 10/020,561

(22) Filed: Dec. 7, 2001

(65) Prior Publication Data

US 2002/0155384 A1 Oct. 24, 2002

(30) Foreign Application Priority Data

Dec. 8, 2000 (DE) .......................... 100 61 480
Sep. 13, 2001 (DE) .......................... 101 45 075

(51) Int. Cl.[7] .......................... G03B 27/52; G03B 27/54
(52) U.S. Cl. .......................... 355/30; 355/67
(58) Field of Search .................. 355/70, 67; 359/507, 359/509, 665, 667

(56) References Cited

U.S. PATENT DOCUMENTS

| 4,871,237 | A | | 10/1989 | Anzai et al. | |
|---|---|---|---|---|---|
| 5,025,284 | A | * | 6/1991 | Komoriya et al. | 355/53 |
| 5,157,555 | A | | 10/1992 | Reno | |
| 6,252,648 | B1 | | 6/2001 | Hase et al. | |
| 6,341,006 | B1 | * | 1/2002 | Murayama et al. | 355/53 |
| 6,411,368 | B1 | * | 6/2002 | Matsumoto et al. | 355/67 |
| 6,614,504 | B2 | * | 9/2003 | Aoki et al. | 355/30 |
| 6,628,371 | B1 | * | 9/2003 | Ishikawa | 355/69 |
| 6,646,713 | B2 | * | 11/2003 | Ishii | 355/30 |

FOREIGN PATENT DOCUMENTS

| EP | 0 867 774 A2 | 9/1998 |
|---|---|---|
| EP | 1 098 225 A2 | 5/2001 |
| JP | 5-210049 | 8/1993 |

* cited by examiner

*Primary Examiner*—Rodney Fuller
(74) *Attorney, Agent, or Firm*—Well St. John P.S.

(57) ABSTRACT

In a system for flushing at least one internal space of an objective, in particular an exposure projection objective for semiconductor lithography, flushing is performed by mixing at least two inert gasses in such a way that the refractive index resulting therefrom corresponds at least approximately to the refractive index of air.

24 Claims, 1 Drawing Sheet

SYSTEM FOR FLUSHING AT LEAST ONE INTERNAL SPACE OF AN OBJECTIVE

RELATED APPLICATIONS

This application relates to and claims priority to corresponding German Patent Application No. 100 61 480.9 filed on Dec. 8, 2000, and German Patent Application No. 101 45 075.3 filed on Sep. 13, 2001.

BACKGROUND OF THE INVENTION

1. Field of the Invention

The invention relates to a system for flushing at least one internal space of an objective.

More specifically the invention relates to a system for flushing at least one internal space of a microlithographic projection exposure objective for manufacturing semiconductors.

2. Description of the Invention

It is generally known to seal off objectives, in particular exposure projection objectives for manufacturing of semiconductors, from the surroundings and to flush the internal space(s) of the objective with the aid of a flushing gas in order to avoid contamination from outside, the operation being performed with a slight overpressure.

Because of the chemical stability of inert gasses, it has already been proposed to carry out flushing with the aid of such a gas.

With regard to the general prior art, reference may be made in this context to U.S. Pat. No. 5,157,555, in which it has been proposed to undertake a correction of spherical aberrations by means of a variable air gap between neighboring surfaces.

U.S. Pat. No. 6,252,648 B1 describes an exposure apparatus in microlithography, and an exposure method, a closed space being introduced in an objective in order to avoid contamination and to clean a mixture or an inert gas and oxygen.

U.S. Pat. No. 4,871,237 has proposed improving the optical imaging accuracy of an objective by changing the barometric pressure of an internal space of an objective. Various gasses and gas mixtures are proposed as medium for the internal space in order to change the refractive index in the gas mixture.

Flushing with the aid of an inert gas entails comparatively high costs which, although entirely acceptable during the operation of an objective, entail a substantial cost outlay in the phase of adjusting and mounting. If it is now desired to operate an objective in this phase of mounting and adjustment with the aid of the very cost-effective flushing gas of air, its imaging is calculated for flushing with air. If, in its final proper use, however, the objective is to be flushed with the very much more expensive inert gas, the problem arises that these gasses have a refractive index which deviates substantially from the refractive index of air. This results in aberrations which would lead to malfunctioning of the objective.

It is therefore the object of the present invention to create a system for flushing at least one internal space of an objective, on the one hand the use of inert gasses for flushing being rendered possible, but on the other hand no changed refractive index being introduced.

SUMMARY OF THE INVENTION

This object is achieved according to the invention by means of a system for flushing at least one closed internal space of an objective, the flushing being performed by mixing at least two inert gasses in such a way that the refractive index resulting therefrom corresponds at least approximately to the refractive index of air.

According to the invention, inert gasses are now intermixed in such a way that the refractive index resulting therefrom corresponds to the refractive index of air. The result of this is that the objectives can firstly be operated with the very favorable flushing gas of air and being adjusted and mounted. Not until the final adjustment and/or the final proper use of the objectives in situ is the change then made to flushing with an inert gas mixture. In this case, there is the advantage of chemical stability over a long operating period. Aberrations which lead to malfunctioning of the objective are reliably avoided by the adaptation of the refractive index.

Experiments have shown in practice that the object set can be achieved very effectively in an economical way when, in the case of the use of two inert gasses, use is made of nitrogen and helium as the gasses, nitrogen constituting the main constituent with 95 to 99.5% by volume, preferably even 98.8%, and this mixture can be used to create in conjunction with helium a refractive index which largely corresponds to that of air.

Of course, yet further inert gas mixtures are possible with other gas compositions within the scope of the invention.

By means or an appropriate adaptation or mixing ratio, it is also possible if necessary specifically to set refractive index changes for the purpose of correcting aberrations which occur.

This means that, if necessary, objectives already used in practice can also be improved by means of this gas mixture.

BRIEF DESCRIPTION OF THE DRAWINGS

An exemplary embodiment of the invention is described below in principle with the aid of the drawing, in which.

DETAILED DESCRIPTION OF THE PREFERRED EMBODIMENTS

Figure 1:
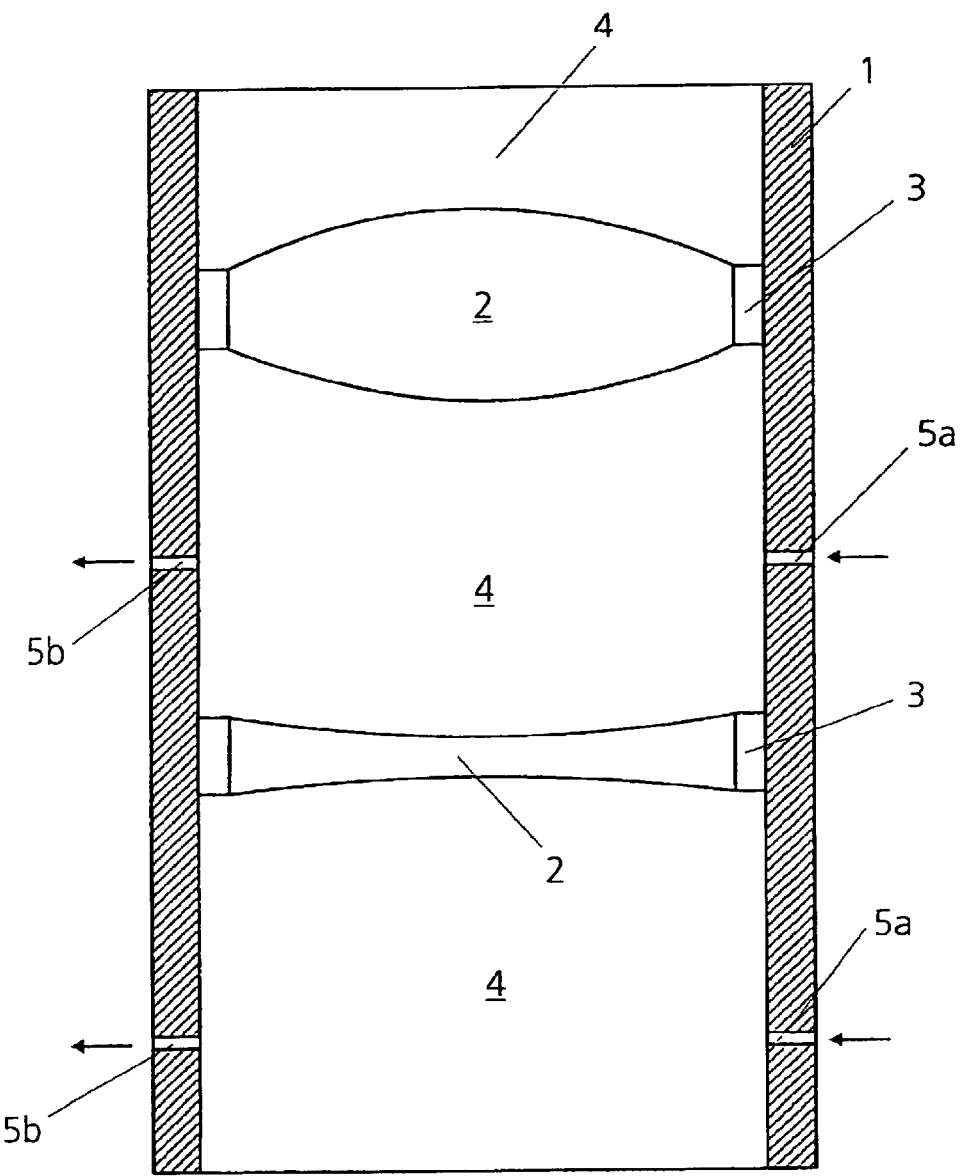
FIG. 1 shows a projection objective of a projection exposure machine for semiconductor lithography.

FIG. 1 illustrates a projection objective 1 for semiconductor lithography only in part and only in principle, since its design is fundamentally known. The objective 1 has a multiplicity of lenses 2 which are connected to the objective via frames or holders 3.

The interior of the objective is closed with respect to the external surroundings, or at least largely sealed off, a plurality of individual internal spaces 4 being present as a rule between the lenses 2. The internal spaces 4 are under a slight overpressure and are flushed via very small bores 5, bores 5a constituting inlet openings and bores 5b outlet openings.

The flushing can be carried out very generally in the following way:

The flushing can be performed by a gas mixture composed of nitrogen with a volumetric fraction of 98.8% and helium as inert gas with a volumetric fraction of 1.2%. If appropriate, the use of another inert gas instead of helium is also possible, in which case the composition must then, or course, be changed appropriately order to produce overall a refractive index in the internal spaces 4 which corresponds to that of air, for which the objective 1 was calculated.

The calculation for the purpose of matching the refractive index of the gas mixture of nitrogen and helium for the purpose of adaptation to the refractive index of air is performed in accordance with the following formula:

$$N_{mix} = n_1 * q_1 + n_2 * q_2$$

where $q_1 + q_2 = 1$. $N_{mix}$: is the refractive index of the mixture; $n_1, n_2$ is the refractive index of $Gas_1$ or $Gas_2$, respectively; and $q_1, q_2$: is the fraction of $Gas_1$ or $Gas_2$, respectively.

Air is understood as a composition of nitrogen and oxygen which can, of course, fluctuate inside a certain range within the scope of the invention. This means that the expression "air" used in the application signifies in a very general way compositions resembling air. Thus, for example, synthetic air can be used as air, the fraction of nitrogen being between 78 and 80% by volume, and the fraction of oxygen between 20 and 22% by volume.

Concrete exemplary embodiments are specified below of a wavelength which is specified merely by way of example. The refractive index data relates in each case to a temperature of 22° C. and a pressure of 950 mbar. The refractive indices which relate to other temperatures and pressures can be converted with the aid of the formula of Lorentz-Lorenz (see, for example, M. Born, E. Wolf, Principles of Optics, 6th edition, (Pergamon, London 1980), pages 87–98).

1) Replacement of air at 243.4 nm by a nitrogen-helium mixture:

the mixing ratio is calculated as 1.360% helium with 98.64% nitrogen from the refractive indices for dry air with 79.5% by volume of nitrogen (N) and 20.5% by volume of oxygen ($O_2$) in accordance with the refractive indices of air after F. Kohlrausch, Prakzische Physik, [Practical Physics], volume 1, section 5.1.1.2.3, (B. G. Teubner, Stuttgart, 1968) of 1.0002763, for nitrogen in accordance with the refractive indices of nitrogen after U. Griesmann, J. H. Burnett, "Refractivity of nitrogen gas in the vacuum ultraviolet", OPTICS LETTERS, Vol. 24, No. 23 (December 1999) of 1.0002797, and for helium in accordance with the refractive indices of helium after R. Abjean, A. Mehu, A. Johannin-Gilles, "Mesure interferometrique des indices de refraction de l'helium et du neon dans l'ultraviolet", [Interferometric measurement of the refracted indices of helium and neon in the ultraviolet"], C. R. Acad. Sc. Paris, t271 (Oct. 19, 1970)—Series B—835 of 1.0000314.

2) Replacement of synthetic air at 248.4 nm by a nitrogen-helium mixture:

a) synthetic air with 80% nitrogen and 20% oxygen: the refractive index of the synthetic air (80% $N_2$, 20% $O_2$) is obtained as 1.0002766 from the refractive indices for nitrogen in accordance with the finding as at 1), refractive indices for nitrogen of 1.0002797 and for oxygen in accordance with the refractive indices of oxygen after R. Ladenburg, G. Wolfsohn, Z. Phys. 79 [1932], 42/61, 53, of 1.0002642. The mixing ratio or the replacement mixture is calculated as 1.24% helium with 98.76% nitrogen with the aid of the refractive index for helium in accordance with the finding as for 1) of 1.0000314.

b) synthetic air with 78% nitrogen and 22% oxygen: the refractive index of the synthetic air (78% $N_2$, 22% $O_2$) is obtained as 1.0002763 from the refractive indices for nitrogen in accordance with the finding as for 2a) of 1.0002797, and for oxygen in accordance with the finding as 2a) of 1.0002642. The mixing ratio of the replacement mixture is calculated as 1.37% helium with 98.63% nitrogen with the aid of the refractive index for helium in accordance with the finding as for 1) of 1.0000314.

Another nitrogen-inert gas mixture is to be provided if appropriate in the case of other wavelengths. This holds, for example, for replacement of (synthetic) air at 193 nm. Krypton and xenon, for example, can be used in this case as alternative inert gasses instead of helium.

Projection objectives for semiconductor lithography frequently change their imaging characteristics during operation or transportation. These characteristics must therefore be corrected from time to time by means of mechanical manipulators. If a specific inhomogeneous flushing is now undertaken of one or more air spaces, largely sealed off from the remainder of the objective, with the aid of gasses of different refractive indices, it is possible, as the case may be, to dispense with mechanical manipulators. For this purpose, nozzles arranged in an appropriate distribution on the circumference can spray different gasses into the air space of the objective. Depending on the gasses introduced, this results, in a fashion distributed over the circumference, in different refractive indices of the gasses in accordance with different local refraction regions in the air or gas space. These locally differing refraction regions are a function in this case of the position and direction of inflow of the gasses. Thus, for example, there are produced in the vicinity of the nozzle area of a specific gas regions which correspond to the refractive index of the in flowing gas, while in another regions corresponding mixtures with a further gas or else with a plurality of other gasses are present, resulting correspondingly in other refractive index in this region. Aberrations during operation of the projection objective can be manipulated in this way, the result being effects which correspond to the action of z- and x-/y-manipulators or an active lens.

A precondition for this is, of course, that during operation a stationary or at least quasi-stationary operation is set up, or that correspondingly reproducible regions are produced in the gas space with a constant gas composition so that reproducible ratios are produced with reference to the correction of imaging characteristics. This means that it must be possible to represent specific, stable mixing gradients of the gasses in the closed gas space.

This means in design terms that the inlet openings 5a and outlet opening 5b illustrated in FIG. 1 are to be arranged distributed correspondingly over their circumference of the objective 1, and that locally differing gasses are to be introduced via the inlet openings.

Figure 2:
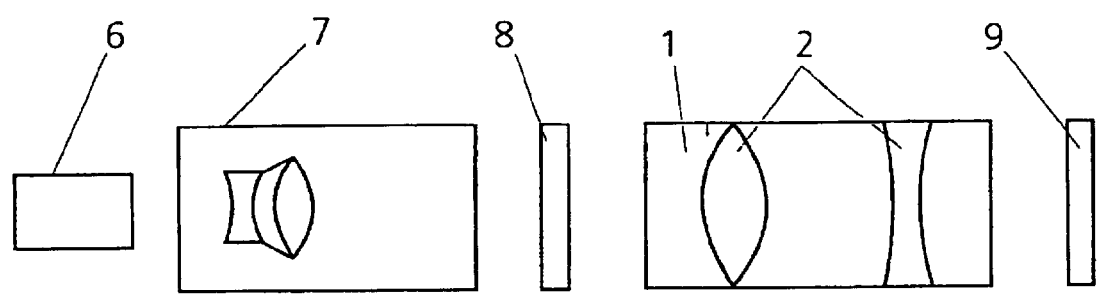
FIG. 2 shows a schematic of a projection exposure machine having a projection objective according to the invention.

FIG. 2 is a schematic of a protection exposure machine having a projection objective 1 in accordance with the illustration in FIG. 1. Since the projection exposure machine in accordance with the exemplary embodiment is known in principle, see, For example, DE 100 02 26 A1, this design will be examined only briefly below. It comprises a light source 6, an illuminating system 7, a structure mask 8 also termed reticle, the projective objective 1, which is designed as a reduction objective, and an object to be exposed, specifically a wafer 9. An excimer laser, for example, can be used as light source 6. Provided in the illuminating system 7 are optical components for beam shaping, for beam homogenization and for correct illumination of the structure mask 8 and the projection objective 1. The object to be exposed can be a silicon wafer 9 coated with photoresist.

What is claimed is:

1. A system for flushing at least one closed internal space of an objective, the at least one closed internal space comprising a plurality of openings for delivering a gas into the at least one closed internal space, flushing being performed by mixing at least two inert gasses in such a way that the refractive index resulting therefrom corresponds at least approximately to the refractive index of air; and wherein the at least two inert gases are devoid of oxygen.

2. The system as claimed in claim 1, wherein the objective is provided as an exposure projection objective for semiconductor lithography.

3. The system as claimed in claim 1, wherein in the case of use of two inert flushing gasses, the refractive index of one flushing gas is above that of air, and the refractive index of the second flushing gas is below that of air.

4. The system as claimed in claim 3, wherein nitrogen is used as first flushing gas, and an inert gas is used as second flushing gas.

5. The system as claimed in claim 3, wherein helium is used as inert gas.

6. The system as claimed in claim 5, wherein nitrogen in a volumetric fraction of 95 to 99.5% and helium in a volumetric fraction of 0.5 to 5% are used.

7. The system as claimed in claim 6, wherein helium in a volumetric fraction of 1.1 to 1.3, preferably 1.2% is used.

8. The system as claimed in claim 3, wherein krypton is used as inert gas.

9. The system as claimed in claim 3, wherein xenon is used as inert gas.

10. The system as claimed in claim 1, wherein the at least two inert gases comprises only inert gases.

11. A method for flushing an objective, comprising:
providing an objective having at least two lenses forming a chamber within the objective; and
flushing the chamber with gases devoid of air in such a way that the refractive index resulting therefrom corresponds at least approximately to the refractive index of air, wherein the chamber comprises different regions and wherein each region comprises a different refractive index.

12. A method for flushing an objective, comprising:
providing an objective having at least two lenses forming a chamber within the objective; and
flushing the chamber with gases devoid of oxygen in such a way that the refractive index resulting therefrom corresponds at least approximately to the refractive index of air, wherein the chamber comprises a mixing gradient of gases.

13. The method as claimed in claim 12, wherein the flushing comprises flushing with only inert gases.

14. The method as claimed in claim 12, wherein the gases are devoid of air.

15. A method for adjusting optical characteristics of an objective, comprising:
providing an objective having at least two lenses forming a chamber within the objective;
providing a plurality of openings in the objective to the chamber; and
adjusting a refractive index of the objective in such a way that the refractive index resulting therefrom corresponds at least approximately to the refractive index of air by providing only inert gases within the chamber, wherein one inert gas is provided in one opening and a different inert gas is provided in a different opening.

16. A method for adjusting optical characteristics of an objective, comprising:
providing an objective having at least two lenses forming a chamber within the objective, the objective having a set of optical characteristics comprising at least a first refractive index;
changing the first refractive index to a second refractive index;
adjusting the refractive index of the objective to the first refractive index in such a way that the refractive index resulting therefrom corresponds at least approximately to the refractive index of air by providing a gaseous mixture within the chamber, the gaseous mixture comprising at least about 95% by volume of nitrogen.

17. A semiconductor lithography method comprising:
providing an objective having at least two lenses forming a chamber within the objective;
cleaning the objective by flushing a first gas through the chamber; and
after the cleaning, providing a second gas within the chamber different from the first gas, wherein the refractive index of the second gas corresponds at least approximately to the refractive index of air.

18. The method as claimed in claim 17, wherein the first gas comprises air.

19. The method as claimed in claim 17, wherein the second gas comprises a gaseous mixture devoid of oxygen.

20. The method as claimed in claim 17, wherein the first gas comprises only air and the second gas comprises only inert gases.

21. A method of forming and using an objective, comprising:
forming an objective by mounting at least two lenses in the objective to form a chamber within the objective;
during the forming, providing air in the chamber; and
during use of the objective, providing at least one inert gas in the chamber.

22. The method as claimed in claim 21, wherein the providing of the air comprises providing only air.

23. A method of forming and using an objective, comprising:
forming an objective by mounting at least two lenses in the objective to form a chamber within the objective;
during the forming, providing air in the chamber; and
during use of the objective, providing at least two inert gases in the chamber, wherein the refractive index of the at least two inert gases corresponds at least approximately to the refractive index of the air in the chamber during the forming.

24. The method as claimed in claim 23, wherein the providing of the air comprises providing only air.

* * * * *

UNITED STATES PATENT AND TRADEMARK OFFICE
CERTIFICATE OF CORRECTION

PATENT NO. : 6,825,914 B2
DATED : November 30, 2004
INVENTOR(S) : Joachim Schroeder et al.

It is certified that error appears in the above-identified patent and that said Letters Patent is hereby corrected as shown below:

Column 1,
Line 37, replace "contamination and to clean a mixture or an inert gas and" with
-- contamination and to clean a mixture of an inert gas and --.

Column 2,
Line 27, replace "By means or an appropriate adaptation or mixing ratio, it" with
-- By means of an appropriate adaptation or mixing ratio, it --.
Line 64, replace "also possible in which case the composition must then, or" with
-- also possible in which case the composition must then, of --.
Line 65, replace "course, be changed appropriately order to produce overall a" with
-- course, be changed appropriately in order to produce overall a --.

Column 3,
Line 25, replace "1) Replacement of air at 243.4 nm by a nitrogen-helium" with
-- 1) Replacement of air at 248.4 nm by a nitrogen-helium --.
Line 27, replace "the mixing ratio is calculated as 1.360% helium with" with
-- the mixing ratio is calculated as 1.36% helium with --.
Line 31, replace "after F. Kohlrausch, Prakzische Physik, [Practical Physics]," with
-- after F. Kohlrausch, Praktische Physik, [Practical Physics], --.

Column 4,
Line 44, replace "FIG. 2 is a schematic of a protection exposure machine" with
-- FIG. 2 is a schematic of a projection exposure machine --.
Line 48, replace "principle, see, For example, DE 100 02 26 A1, this design" with
-- principle, see, for example, DE 100 02 26 A1, this design --.

Signed and Sealed this

Twenty-third Day of August, 2005

JON W. DUDAS
*Director of the United States Patent and Trademark Office*